US009641146B2

(12) United States Patent
Nash et al.

(10) Patent No.: US 9,641,146 B2
(45) Date of Patent: May 2, 2017

(54) APPARATUS AND METHOD FOR DETECTING RADIO FREQUENCY POWER

(75) Inventors: Eamon Nash, Chicago, IL (US); Dale Wilson, Newburyport, MA (US); Carlos Calvo, Framingham, MA (US)

(73) Assignee: Analog Devices, Inc., Norwood, MA (US)

( * ) Notice: Subject to any disclaimer, the term of this patent is extended or adjusted under 35 U.S.C. 154(b) by 1978 days.

(21) Appl. No.: 12/778,821

(22) Filed: May 12, 2010

(65) Prior Publication Data

US 2011/0279192 A1    Nov. 17, 2011

(51) Int. Cl.
*H01P 5/18*    (2006.01)
*H03G 3/30*    (2006.01)

(52) U.S. Cl.
CPC ............................... *H03G 3/3042* (2013.01)

(58) Field of Classification Search
USPC .............................................................. 324/95
See application file for complete search history.

(56) References Cited

U.S. PATENT DOCUMENTS 3,042,864 A *  7/1962  Godbey ..................... 324/76.27
2005/0059362 A1*  3/2005  Kalajo et al. ............... 455/127.1

OTHER PUBLICATIONS

Agilent RF and Microwave Test Accessories, Directional Couplers and Bridges, 2000, p. 1-3.*
Mini-Circuits Directional Couplers, 1999, p. 1-6.*
Honeywell HRF SW1000, 2002, p. 1-6.*
Switches Demystified Assembly, p. 1, http://ebookbrowse.com/switches-demystified-assembly-pdf-d381736317.*
SPST, SPDT, and DPDT Switches Demystified, http://www.musicfromouterspace.com/analogsynth_new/ELECTRONICS/pdf/switches_demystified_assembly.pdf, p. 1.*
VSWR, or Voltage Standing Wave Ratio, http://emc.toprudder.com/vswr.pdf, p. 1-3.*
Analog Devices, "ADL5500: 100 MHz to 6 GHz TruPwr™ Detector," Feb. 2006, available at http://www.analog.com/en/rfif-components/rms-detectors/adl5500/products/product.html.
Analog Devices, "ADL5501: 50 MHz to 6 GHz TruPwr Detector," Jun. 2009, available at http://www.analog.com/en/rfif-components/rms-detectors/adl5501/products/product.html.
Analog Devices, "ADL5502: 450 MHz to 6000 MHz Crest Factor Detector," Nov. 2008, available at http://www.analog.com/en/rfif-components/rms-detectors/adl5502/products/product.html.
Analog Devices, "AD8361: 2.5 GHz TruPwr™ Detector," Aug. 2004, available at http://www.analog.com/en/rfif-components/rms-detectors/ad8361/products/product.html.
Analog Devices, "AD8318: 1 MHz to 8 GHz, 70 dB Logarithmic Detector/Controller," Apr. 2007, available at http://www.analog.com/en/rfif-components/log-ampsdetectors/ad8318/products/product.html.

(Continued)

*Primary Examiner* — Thomas Valone
(74) *Attorney, Agent, or Firm* — Knobbe, Martens, Olson & Bear, LLP

(57) ABSTRACT

Apparatus and methods are disclosed related to radio frequency (RF) power detection. One such apparatus includes a directional coupler, an RF switch, and an RF power detector. The RF switch can selectively change coupling between the directional coupler and the RF power detector. This can enable accurate power detection based on a ratio of power levels, without factory calibration or laser trimming.

17 Claims, 7 Drawing Sheets

(56) References Cited

OTHER PUBLICATIONS

Analog Devices, "AD8302: 2.7GHz RF / IF Gain Phase Detector," Jul. 2002, available at http://www.analog.com/en/rfif-components/log-ampsdetectors/ad8302/products/product.html.
Analog Devices, "AD8364: LF to 2.7GHz, Dual 60dB TruPwr™ Detector," May 2005, available at http://www.analog.com/en/rfif-components/rms-detectors/ad8364/products/product.html.
Analog Devices, "ADL 5500 Data Sheet," Feb. 2006, 24 pages.
Analog Devices "ADL 5501 Data Sheet," Jun. 2009, 28 pages.
Analog Devices "ADL 5502 Data Sheet," Nov. 2008, 28 pages.
Analog Devices "AD 8361 Data Sheet," Aug. 2004, 24 pages.
Analog Devices, "AD 8318 Data Sheet," Apr. 2007, 24 pages.
Analog Devices, "AD 8302 Data Sheet," Jul. 2002, 24 pages.
Analog Devices, "AD 8364 Data Sheet," May 2005, 48 pages.

\* cited by examiner

APPARATUS AND METHOD FOR DETECTING RADIO FREQUENCY POWER

BACKGROUND

Field

Embodiments of the invention relate to electronics, and more particularly, to radio frequency (RF) power detection.

Description of the Related Technology

Transmitters, transceivers, transmitter/receivers, and the like, can include radio frequency (RF) amplifiers. These various sources of RF will be referred to herein as RF sources. When an RF signal is transmitted from an RF source to an RF load, such as to an antenna, a portion of the RF signal can be reflected from the load. For example, a mismatch in impedance between an output impedance of an RF source and an RF load can cause reflections, and can be measured by a voltage standing wave ratio (VSWR) meter. In addition, in portable applications, such as mobile phones, the position of the antenna can change, resulting in unpredictable changes to impedance, which in turn results in reflected RF power.

The reflection of RF signals can cause undesirable effects, including a power loss in the transmitted RF signals and possibly even damage to the RF source. In addition, the reflected RF signal may in turn be reflected by the RF source, and re-transmitted with a slight time delay with respect to the original RF signal. Because of problems associated with the reflection of RF signals, RF sources can include a feature for monitoring the reflection of RF signals.

SUMMARY

In one embodiment, an apparatus includes a switch and a radio frequency (RF) power detector. The switch has at least a first node, a second node, and a third node. The switch can selectively operatively couple at least on of the first node or second node to the third node in response to a control signal. The RF power detector has a detector input. The RF power detector is configured to generate a signal indicative of RF power at the detector input as an output of the detector. The detector input is electrically coupled to the third node of the switch such that the RF power detector can provide a first indication of power at the first node or a second indication of power at the second node depending on the position of the switch.

In another embodiment, a method is provided for calculating a reflected power ratio. The method includes providing a directional coupler, a switch, an RF power detector, and a processor. The switch is configured to selectively operatively couple at least one of a third terminal or a fourth terminal of the directional coupler to an input of the RF power detector. An input of the processor is electrically coupled to an output of the RF power detector. The method also includes controlling the switch such that the RF power detector outputs a signal representative of a forward RF power, and controlling the switch such that the RF power detector outputs a signal representative of a reflected RF power. The method further includes calculating, using the processor, a ratio of the forward RF power and the reflected RF power.

In another embodiment, an apparatus includes an RF switch and a directional coupler. The RF switch has at least a first node, a second node, and a third node, wherein the RF switch is configured to selectively electrically couple at least one of the first node or the second node to the third node in response to a control signal. The directional coupler has a first terminal, a second terminal, a third terminal, and a fourth terminal. The third terminal is configured to extract a portion of an RF signal traveling in a direction from the first terminal to the second terminal. The fourth terminal is configured to extract a portion of an RF signal traveling in a direction from the second terminal to the first terminal. The directional coupler is also configured to receive the RF signal at the first terminal and to generate the RF sample of the RF signal at the third terminal. The third terminal of the directional coupler is operatively coupled to the first node of the RF switch, and the fourth terminal of the directional coupler is operatively coupled to the second node of the RF switch.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed. As used herein, "electrically coupled" or "coupled" include coupling via radio frequency techniques.

DETAILED DESCRIPTION OF EMBODIMENTS

Figure 1:
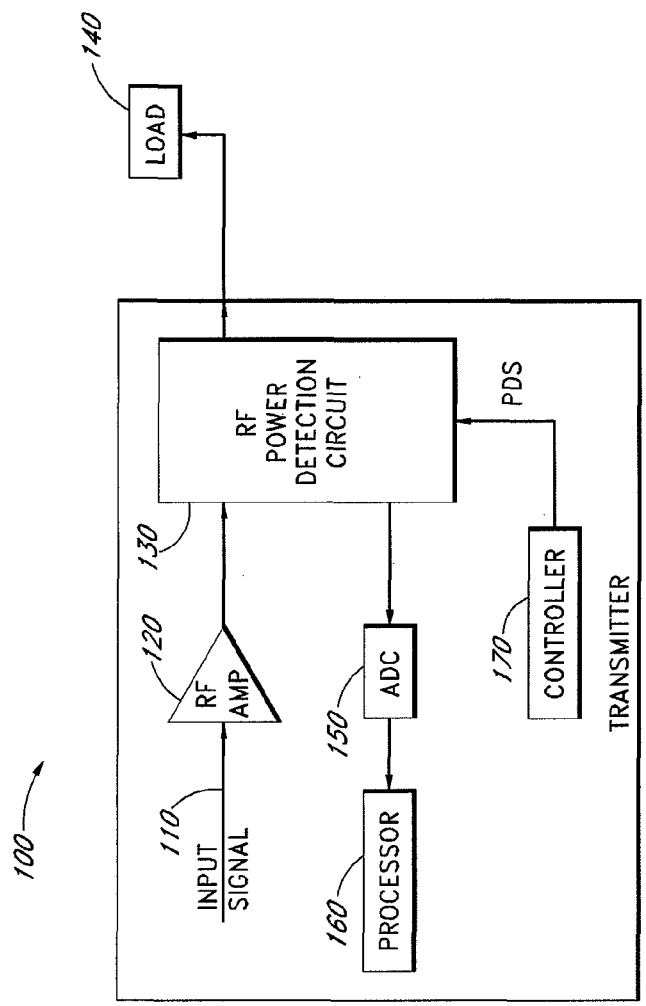
FIG. 1 is a block diagram illustrating a transmitter with an RF power detection circuit.

The following detailed description of embodiments presents various descriptions of specific embodiments of the invention. However, the invention can be embodied in a multitude of different ways as defined and covered by the claims. In this description, reference is made to the drawings where like reference numerals indicate identical or functionally similar elements.

As discussed above, an electronic device, such as a wireless transmitter, can include an RF source that amplifies and provides RF signals to an RF load, such as to an antenna. A mismatch between the impedances of the RF source and load can cause a portion of the RF signal to reflect back to the RF source. A detection circuit can be used to detect the forward power and the reflected power of such RF signals. The detection circuit can measure an RF signal provided to the load or reflected from the load.

Such detection circuits typically require calibration during manufacture of end equipment. The process of calibration can be time-consuming and costly. Accordingly, there is a need for an RF power detection circuit that does not need calibration.

Overview of a Transmitter with RF Power Detection

Referring to FIG. 1, a transmitter 100 according to an embodiment will be described below. The principles and advantages are applicable to wired environments and to wireless environments. Wired environments include, but are not limited to, DSL lines, cable television and/or cable modem lines, and the like. Wireless environments can include cell phones, wireless data networks, such as IEEE 802.11 (WiFi), IEEE 802.16 (WiMax), WCDMA (Wideband Code Division Multiple Access), LTE (Long Term Evolution), CDMA2000, GSM/EDGE (Enhanced Data rates for GSM Evolution), TD-SCDMA (Time Division Synchronous Code Division Multiple Access), satellite communications, and the like. The transmitter 100 can be part of any electronic device.

The illustrated transmitter 100 includes an RF amplifier 120 configured to receive an input signal 110, an RF power detection circuit 130, a load 140, an analog-to-digital converter (ADC) 150, a processor 160, and a controller 170. A skilled artisan will appreciate that one or more of the components of the transmitter 100 can be implemented in one or more chips or integrated circuits. A skilled artisan will also appreciate that the transmitter 100 can further include other components between the RF amplifier 120 and the RF power detection circuit 130 and/or between the RF power detection circuit 130 and the load 140.

The input signal 110 serves to provide to the RF amplifier 120 with a modulated RF signal. The input signal 110 can represent a wide variety of data, including, but not limited to, audio data (for example, voice data), video data, and control data.

The RF amplifier 120 serves to amplify the input signal 110. The RF amplifier 120 can provide an amplified RF signal to the load 140 through the RF power detection circuit 130.

The RF power detection circuit 130 serves to monitor the power of RF signals. In the illustrated embodiment, the RF power detection circuit 130 is configured to detect a forward power and a reflected power of an RF signal. The forward power of an RF signal refers to the power of the RF signal travelling from a source (for example, the RF amplifier 120) to a load (for example, the load 140). The reflected power of the RF signal refers to the power of a portion of the RF signal that has been reflected from the load back to the source. In response to a control signal provided by the controller 170, the RF power detection circuit 130 can switch between detection of the forward power or the reflected power. In another embodiment, two power detectors can be coupled to a directional coupler such that one can measure forward power and the other can measure reflected power.

The RF power detection circuit 130 can measure a portion of an RF signal passing therethrough to detect the power of the RF signal. The RF power detection circuit 130 can then generate an analog signal, for example, a voltage signal, that is proportional to the power, and provide it to the analog-to-digital converter 150. In one embodiment, the analog signal proportional to power can be provided to the RF amplifier 120. Then the RF amplifier 120 can turn off when the analog signal satisfies a threshold. Turning off the RF amplifier 120 can prevent undesirable effects and possibly even damage to the RF amplifier 120. The RF power detection circuit 130 will be described in more detail later in connection with FIGS. 2A and 2B.

The load 140 serves to receive the amplified RF signal from the RF amplifier 120, and propagate it through a transmission medium, such as air. The load 140 can form at least part of the load of the transmitter 100. In a wired environment, the load 140 can correspond to an input of a downstream device, such as a receiver input. In a wireless environment, the load can correspond to, for example, an antenna.

It is desirable that the impedance of a load is matched to the output impedance of a source. When the output impedance of the source and the impedance of the load are mismatched, the load can reflect at least a portion of the power of the RF signal back to the source.

The analog-to-digital converter 150 serves to convert the analog signal from the RF power detection circuit 130 into a digital signal having a discrete digital value. The digital signal can be provided to the processor 160. The digital signal can be indicative of forward power or reflected power, depending on the operation of the RF power detection circuit 130.

The processor 160 serves to perform computations on the digital signal from the analog-to-digital converter 150. The processor 160 can be any suitable processor having computational capacity to process the digital signal for determining a ratio between the forward power and the reflected power of the RF signal. The processor 160 can include, for example, a microprocessor, microcontroller, licensable core, digital signal processor, or the like. The processor 160 can store instructions stored in a tangible, non-transitory computer-readable medium. The processor 160 can also perform other operations for the transmitter 100.

In some embodiments, the processor 160 can include one or more memories configured to store values associated with digital signals indicative of power, such as in a lookup table (LUT). The processor 160 can also be configured to compute a reflected power ratio, which can represent a ratio of reflected power to forward power. The reflected power ratio can be based at least partly on one or more digital signals from the analog-to-digital converter 150. This computation can include using a value associated with reflected power and a value associated with forward power. The indicator of power loss can be calculated dynamically using the digital signals.

The controller 170 serves to control the operation of the RF power detection circuit 130. The controller 170 can include a processor and one or more memories. The controller 170 can direct the RF power detection circuit 130 to detect either forward power or reflected power by providing a power detection select signal PDS to the RF power detection circuit 130. The controller 170 and the processor 160 can be implemented either separately or together as part of one chip. The controller 170 can also generate various other signals for the operation of the transmitter 100.

In transmitters, such as the transmitter 100, a reflected power ratio can be expressed in various forms, such as a return loss, a reflection coefficient, or a voltage standing wave ratio (VSWR). A change in any of a return loss, a reflection coefficient, or a VSWR corresponds to changes in the other two quantities. Return loss is a measure of source power minus reflected power, and can be expressed in decibels. A reflection coefficient can be calculated by dividing a voltage indicative of the reflected power by a voltage indicative of the forward power. Thus, a reflection coefficient of 0 corresponds to no reflection and a reflection coefficient of +1 corresponds to maximum positive reflection, which can indicate an open-circuit or a short-circuit. VSWR can be calculated by dividing 1 plus the absolute value of the reflection coefficient by 1 minus the absolute value of the reflection coefficient. Thus, a VSWR of 1 corresponds to no reflected power. Equations 1 to 3 summarize these forms:

Return Loss (dB)=Source Power (dB)−Reflected Power (dB)   Equation 1

Reflection Coefficient=$V_R/V_F$   Equation 2

VSWR=(1+|Reflection Coefficient|)/(1−|Reflection Coefficient|)   Equation 3

In Equation 2, $V_R$ represents a voltage indicative of reflected power and $V_F$ represents a voltage indicative of reflected power.

In some embodiments, a reflected power ratio can be used to make adjustments in transmitter 100. For example, the processor 160 can generate a warning in response to a reflection coefficient above a predetermined threshold. In some embodiments, this can be used for turning off the transmitter 100. As another example, a signal indicative of a reflected power ratio generated by the processor 160 can be used to adjust an impedance to achieve better impedance matching. A skilled artisan will appreciate that various circuits can be used for matching impedance based on the signal from the processor.

RF Power Detection Circuit

Figure 2A:
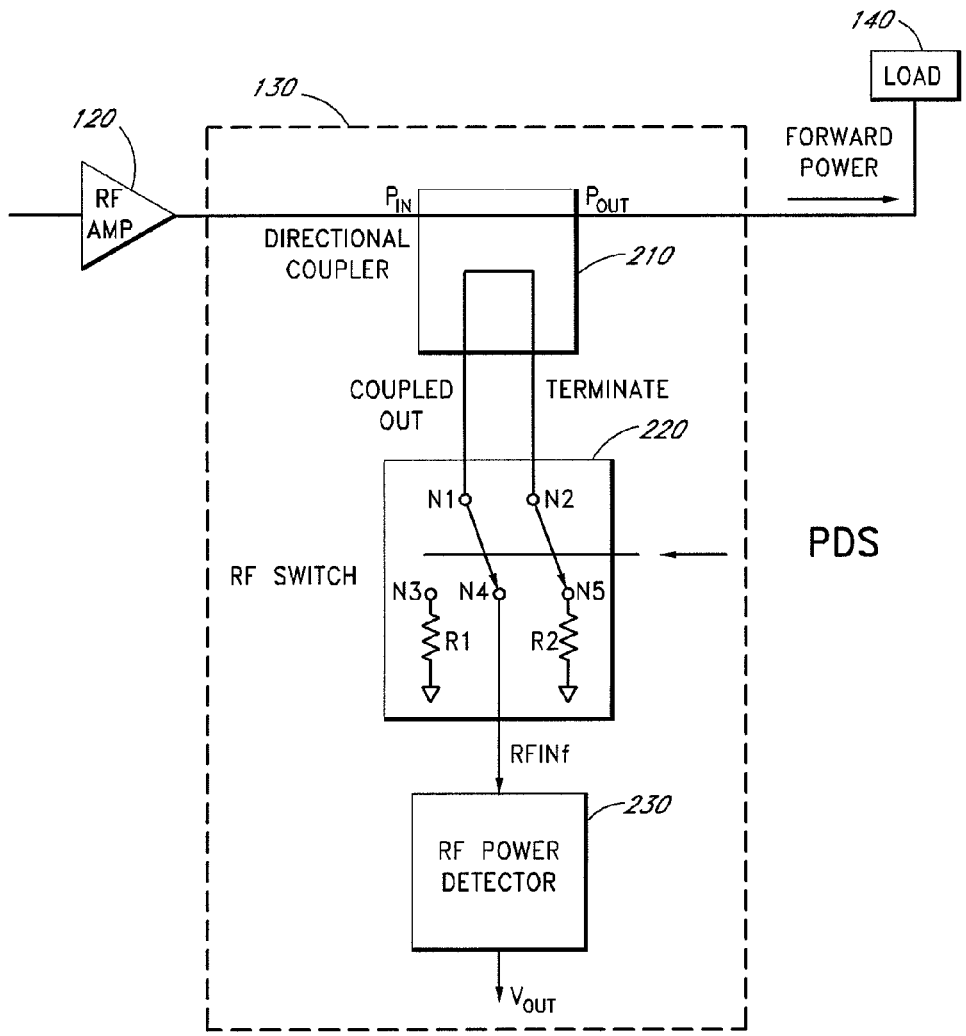
FIG. 2A is a block diagram of an embodiment of the RF power detection circuit, shown in a state to measure forward power.
Figure 2B:
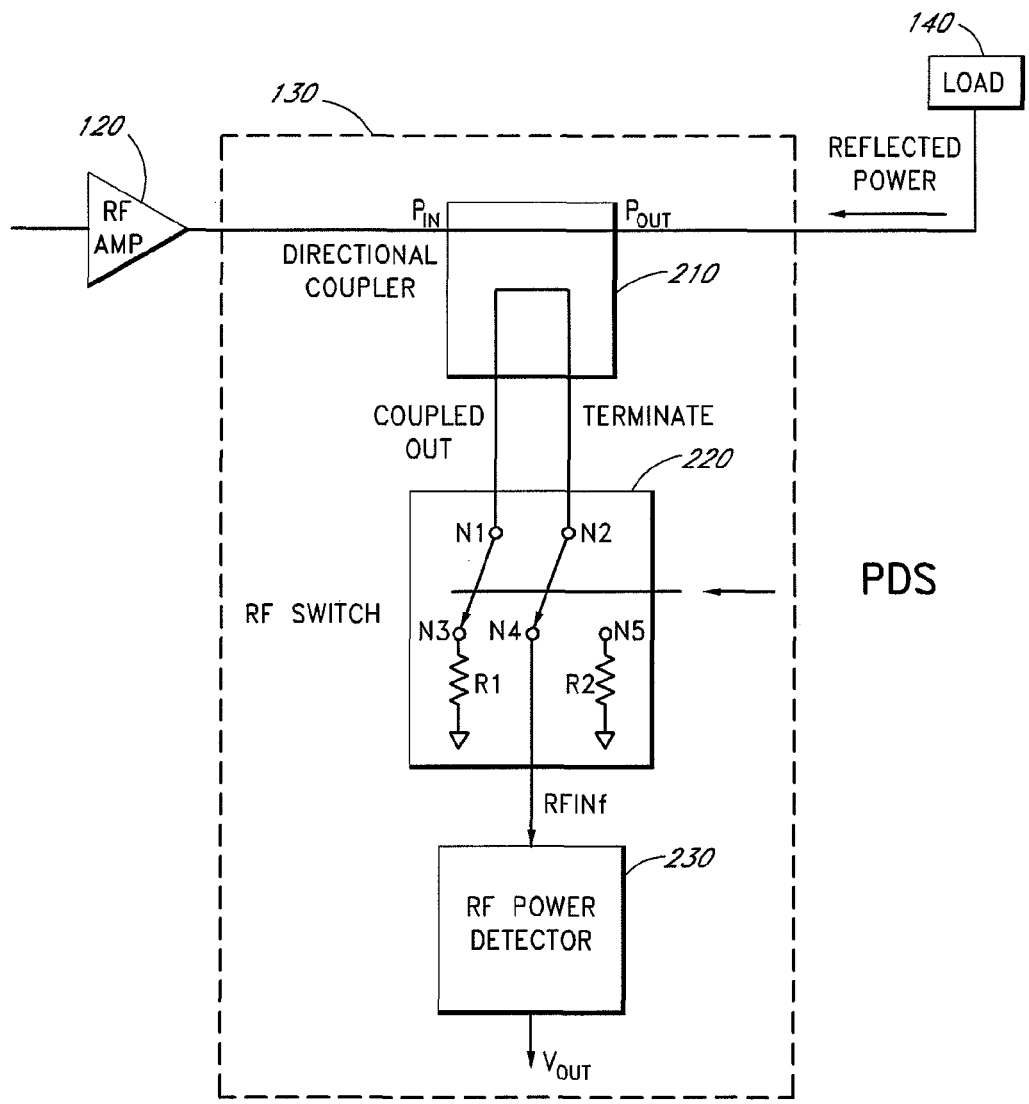
FIG. 2B is a block diagram of the RF power detection circuit of FIG. 2A, shown in a state to measure reflected power.

Referring to FIGS. 2A and 2B, one embodiment of the RF power detection circuit 130 of FIG. 1 will be described below. In the illustrated embodiment, an RF power detection circuit 130 includes a directional coupler 210, an RF switch 220, and an RF power detector 230. In one embodiment, the directional coupler 210, the RF switch 220, and the RF power detector 230 can each be formed on separate integrated circuits or chips. In other embodiments, two or more of the directional coupler 210, the RF switch 220, and the RF power detector 230 can be formed on a single integrated circuit or chip. For example, the RF switch 220 and the RF power detector 230 can form a single integrated circuit or chip.

The directional coupler 210 can extract a portion of the power of an RF signal traveling between the RF amplifier 120 and the load 140. The directional coupler 210 can be implemented from any suitable directional coupler, including, but not limited to, a conventional directional coupler. A skilled artisan will appreciate that various configurations of directional couplers can be adapted for the directional coupler 210.

The directional coupler 210 can include four terminals: a first terminal denoted as Pin, a second terminal denoted as Pout, a third terminal denoted as Coupled-Out, and a fourth terminal denoted as Terminate. The names used for the terminals of the directional coupler 210 are provided for ease of description and do not necessarily imply functionality different from what is described below. The first terminal Pin of the directional coupler 210 can be operatively coupled to the output of the RF amplifier 120. The second terminal Pout of the directional coupler 210 can be operatively coupled to the load 140. The first terminal Pin and second terminal Pout are electrically coupled to each other. The third terminal Coupled-Out can be operatively coupled to a first node N1 of the RF switch 220. As illustrated in the configuration of FIG. 2A, the third terminal Coupled-Out can provide a portion of an RF signal traveling in the direction from the first terminal Pin to the second terminal Pout. The fourth terminal Terminate can be operatively coupled to a second node N2 of the RF switch 220. As illustrated in the configuration of FIG. 2B, the fourth terminal Terminate can provide a portion of an RF signal traveling in the direction from the second terminal Pout to the first terminal Pin.

A ratio of output power at the third terminal Coupled-Out in FIG. 2A (or fourth terminal Terminate in FIG. 2B) to power passing through the directional coupler 210 can be expressed as a coupling factor. A coupling factor at the third terminal Coupled-Out in FIG. 2A can be substantially the same as a coupling factor at the fourth terminal Terminate in FIG. 2B. The power coupled to the third terminal Coupled-Out in FIG. 2A (or the fourth terminal Terminate in FIG. 2B), which is typically small, can be expressed as an insertion loss from the first terminal Pin to the second terminal Pout in FIG. 2A (or the second terminal Pout to the first terminal Pin in FIG. 2B).

The RF switch 220 serves to change connections between the directional coupler 210 and the RF power detector 230. In one state, the third terminal Coupled-Out is coupled to an input of the RF power detector 230, and the fourth terminal Terminate is coupled to a dummy load. In a second state, the third terminal Coupled-Out is coupled to a dummy load, and the fourth terminal Terminate is coupled to the input of the RF power detector 230. The RF switch can switch sufficiently fast such the RF power detector 230 can be used for determining forward RF power and reflected RF power. The RF switch 220 can be implemented by any suitable switch that can selectively operatively couple one terminal of a directional coupler to a dummy load or an RF power detector and another terminal of the directional coupler to the input of the RF power detector or a dummy load. In some embodiments, the RF switch 220 can include a double throw absorptive RF switch.

In response a power detection signal PDS provided directly or indirectly by the controller 170 (FIG. 1), the RF switch 220 can be configured to selectively change electrical coupling between the directional coupler 210 and the RF power detector 230. By changing the electrical coupling, power detected by the RF power detector 230 can change from detecting forward power to detecting reflected power, or from detecting reflected power to detecting forward power.

In the illustrated embodiment, the RF switch 220 includes first to fifth nodes N1-N5, a first dummy load R1, and a second dummy load R2. The first node N1 serves as a first switch input and the second node N2 serves as a second switch input. The fourth node N4 serves as a switch output. The first node N1 is electrically coupled to the third terminal Coupled-Out of the directional coupler 210. The second node N2 is electrically coupled to the fourth terminal Terminate of the directional coupler 210. The third node N3 is electrically coupled to a reference voltage, for example, ground, via the first dummy load R1. The fourth node N4 is electrically coupled to an input of the RF power detector 230. The fifth node N5 is electrically coupled to a reference voltage, for example, ground, via the second dummy load R2. In one embodiment, each of the first and second dummy loads R1, R2 can have a resistance between about 25Ω and about 100Ω, for example, about 50Ω. The dummy loads can be used for purposes of impedance matching. In an alternative embodiment, an RF switch can include only one dummy load and selectively operatively couple different input nodes to the one dummy load depending on the state of the RF switch. In another embodiment, the RF switch can include additional switches between input nodes and output nodes, for example, transistors implementing logic functions.

FIG. 2A shows that the RF power detection circuit 130 is in a state to detect forward power. As illustrated, the first node N1 is electrically coupled to the fourth node N4. In addition, the second node N2 is electrically coupled to the fifth node N5. As a result, the third terminal Coupled-Out of the directional coupler 210 is electrically coupled to the input of the RF power detector 230, and the fourth terminal Terminate of the directional coupler 210 is electrically coupled to the second resistor R2. In the illustrated state, the RF switch 220 provides a forward power signal RFINf to the RF power detector 230.

In response to a state of the power detection signal PDS, the RF switch 220 can switch to a state to detect reflected power, as shown in FIG. 2B. As illustrated, the RF switch 220 electrically couples the first node N1 to the third node N3 and also electrically couples the second node N2 to the fourth node N4. As a result, the third terminal Coupled-Out of the directional coupler 210 is electrically coupled to the first dummy load R1 and the fourth terminal Terminate of the directional coupler 210 is electrically coupled to the input of the RF power detector 230. In the illustrated state, the RF switch 220 provides a reflected power signal RFINr to the RF power detector 230.

The RF power detector 230 serves to receive an input signal RFINf or RFINr at its input from the directional coupler 210 via the RF switch 220 and output an output signal $V_{OUT}$, which is indicative of power. In one embodiment, the output signal $V_{OUT}$ can be a voltage signal. In some embodiments, the RF power detector 230 can be configured to have the output signal $V_{OUT}$ in a linear relationship with the input signal RFINf or RFINr. Further details of the RF power detector 230 will be described in connection with FIGS. 3A, 3B, and 4.

During operation, most of the power from the RF amplifier 120 passes through the directional coupler 210 in the direction toward the load 140. However, a small portion of the power can be coupled to either the third terminal Coupled-Out or the fourth terminal Terminate. When the RF switch 220 is in the state shown in FIG. 2A, the third terminal Coupled-Out can detect forward power traveling from the first terminal Pin to the second terminal Pout of the directional coupler 210. An output power at the third terminal Coupled-Out can be between about 10 dB and about 20 dB lower than the RF power passing through the directional coupler 210 to the load 140 via the second terminal Pout. In contrast, when the RF switch 220 is in the state shown in FIG. 2B, the fourth terminal Terminate can detect reflected power traveling from the second terminal Pout to the first terminal Pin.

In a conventional RF power detection circuit, separate RF power detectors and separate directional couplers are typically used for measurements associated with forward power and for measurements associated with reflected power. These measurements can be used to calculate an indicator of reflected power, such as a ratio of reflected power. In such an RF power detection circuit, factory calibration is typically required for precise calculation of the indicator of reflected power. Factory calibration can compensate for variations in separate power detectors and/or separate directional couplers. For example, the separate power detectors can have different slopes associated with their transfer functions and by the same token the different directional couplers can have different coupling factors. Factory calibration can be used to compensate for these differences and accurately calculate indicators of reflected power, such as a reflection coefficient. Laser trimming can also be used to adjust circuit parameters for accurate calculation of the indicators of reflected power.

Factory calibration can include deriving a slope and an intercept for an associated transfer function of each RF power detector. Deriving a slope and an intercept for a linear transfer function requires at least two output measurements for each RF power detector. Such measurements can be voltage measurements. Associated transfer functions are typically derived from input and output measurements associated with each RF power detector. In addition to deriving transfer functions, factory calibration can include measuring power with a power meter and comparing a result of the power meter to the associated transfer functions. Similar processes can be used to determine coupling factors for the different directional couplers. Factory calibration is typically preformed during manufacture of an end product.

Factory calibration adds additional steps to manufacturing, resulting in higher costs to make components configured to detect indicators of power loss. These steps and costs can be eliminated in accordance with some embodiments.

However, in the embodiments described above, the RF power detection circuit 130, which includes the RF switch 220, can accurately measure a ratio of reflected power without factory calibration by using a single RF power detector 230 and its associated transfer function. Assuming that a coupling factor of the directional coupler 210 is about equal in the forward and reflected coupling directions and an insertion loss of the RF switch 220 does not change much when the RF switch 220 switches from one position to the other, the slope of a transfer function associated with the RF power detector 230 for forward and reflected power will be substantially the same. This allows the processor 160 (FIG. 1) to calculate a ratio of reflected power, using outputs generated from the RF power detection circuit 130, without factory calibration.

For example, a return loss associated with the RF power detection circuit 130 can be calculated from Equation 4 below, where $P_F$ represents forward power, $P_R$ represents reflected power, $V_F$ represents an output voltage from the RF power detector 230 when forward power is being detected, and $V_R$ represents an output voltage from the RF power detector 230 when reflected power is being detected.

$$P_F - P_R (\text{dB}) = 10 \log\left(\frac{V_F^2 - \text{INTERCEPT}}{V_R^2 - \text{INTERCEPT}}\right) \quad \text{Equation 4}$$

Power can be proportional to the square of voltage, and an output voltage $V_{OUT}$ of the RF power detector 230 with a substantially linear transfer function can be modeled as $V_{OUT}=\text{Slope}\times V_{IN}+\text{Intercept}$. Calculating a power difference can involve calculating a ratio of $V_F$ to $V_R$. Because the RF power detector 230 can provide substantially equal gain when detecting either forward or reflected power, the slope can cancel when calculating the power difference, resulting in the Equation 4. For y-intercepts that are close to zero or y-intercepts with values that are small compared to $V_F$ and $V_R$, Equation 4 can be approximated by omitting the intercept. Then, the return loss can be calculated from $V_F$ and $V_R$. Therefore, the calibration step that derives the slope and the intercept of a transfer function is not needed in the embodiment described above.

A skilled artisan will appreciate that other indicators of reflected power than include a reflected power ratio, such as a reflection coefficient and VSWR, can also be calculated without factory calibration, based on the principles described above.

RF Power Detectors

Referring back to FIGS. 2A and 2B, the RF power detector 230 provides an output signal $V_{OUT}$ that is indicative of a power travelling between the RF amplifier 120 and the load 140. An input signal RFINf or RFINr can be amplified by the RF power detector 230 and the output signal $V_{OUT}$ can be a linearly responding voltage scaled by a conversion gain. A transfer function associated with the RF power detector 230 can be linear. The RF power detector 230 can be described as a "linear in volts per volt device" when its associated transfer function is substantially linear. In such a case, the associated transfer function can be modeled as $V_{OUT}=Slope\times V_{IN}+Intercept$, as described earlier.

Figure 3A:
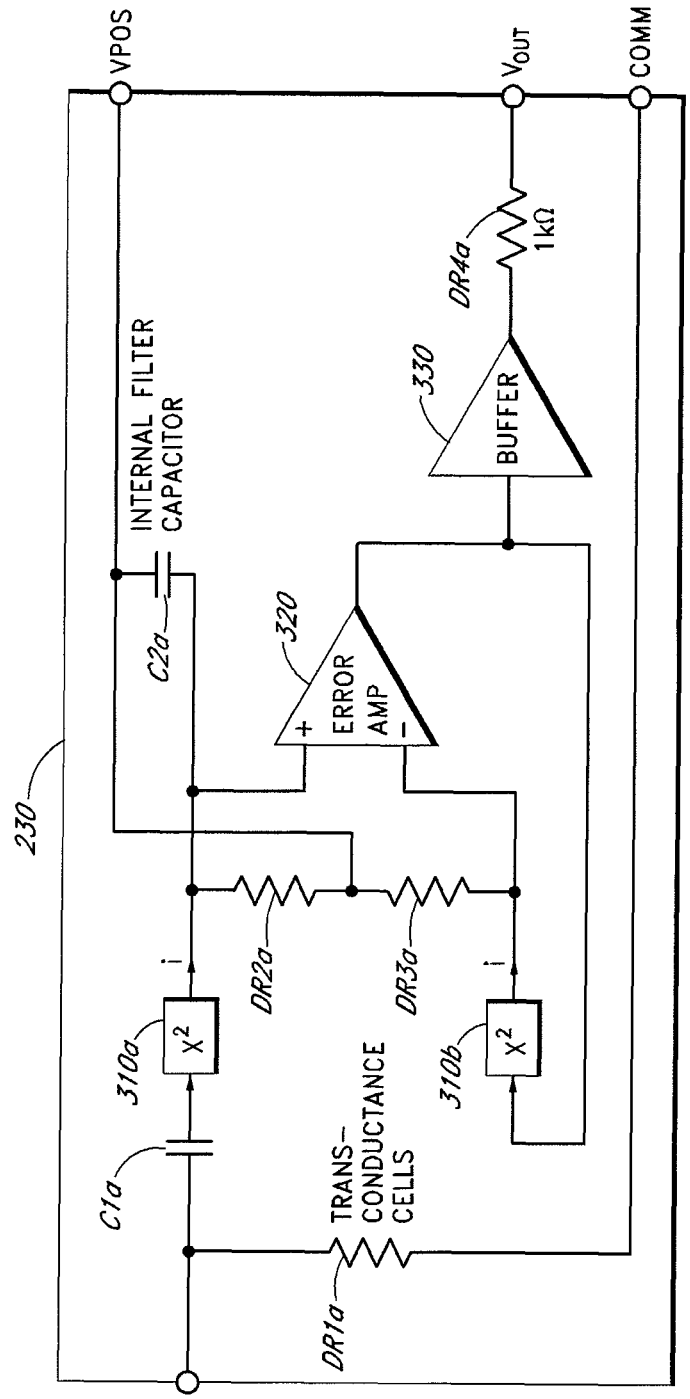
FIG. 3A is a schematic circuit diagram of an example of an RF power detector that can be used with the RF power detection circuit of FIG. 2A

In some embodiments, the RF power detector 230 can include any suitable RF power detector that is a linear in volts per volts device. Referring to FIG. 3A, one example of the RF power detector 230 will be described below.

The RF power detector 230 of FIG. 3A serves to provide an output signal $V_{OUT}$ in response to an input signal RFIN. The illustrated RF power detector 230 includes a first squaring cell 310a, a second squaring cell 310b, a first detector capacitor C1a, a second detector capacitor C2a, first to fourth detector resistors DR1a-DR4a, a comparator 320, and a buffer 330.

With continued reference to FIG. 3A, the input signal RFIN is provided to a first end of the first detector resistor DR1a. A second end of the first detector resistor DR1a is electrically coupled to a voltage reference COMM. The input signal RFIN is also provided to a first terminal of the first detector capacitor C1a. A second terminal of the first detector capacitor C1a is electrically coupled to an input to the first squaring cell 310a. An output of the first squaring cell 310a is electrically coupled to a first end of the second detector resistor DR2a, a first terminal of the second detector capacitor C2a, and a non-inverting input of the comparator 320. A second end of the second detector resistor DR2a is electrically coupled to a first end of the third detector resistor DR3a and a voltage reference VPOS. The voltage reference VPOS is also electrically coupled to a second terminal of the second detector capacitor C2a. A second end of the third detector resistor DR3a is electrically coupled to an output of the second squaring cell 310b and an inverting input of the comparator 320. An output of the comparator 320 is electrically coupled to an input of the buffer 330 and an input of the second squaring cell 310b. An output of the buffer 330 is electrically coupled to a first end of the fourth detector resistor DR4a. A second end of the fourth detector resistor DR4a provides the output signal $V_{OUT}$.

In the illustrated example, the RF power detector 230 uses a mean-responding algorithm for power detection using two substantially identical squaring cells 310a, 310b that can be balanced by the action of the comparator 320. The voltage reference COMM serves as device ground. The voltage reference VPOS serves as a supply voltage. The first detector resistor DR1a can be used for impedance matching. In one embodiment, the first detector resistor DR1a can have a resistance between about 25Ω and about 100Ω, for example, about 50Ω. An input matching network, which can include the first detection resistor DR1a and the first detector capacitor C1a, can also serve as a high pass filter. The comparator 320 can serve as a high gain amplifier. The first squaring cell 310a is configured to generate a current proportional to the square of the voltage of RFIN. A low-pass filter, which can include the second detection resistor DR2a and the second detector capacitor C2a, can generate a mean of the current proportional to the square of the voltage of RFIN and provide it to the non-inverting input of the comparator 320. The second squaring cell 310b is configured to close a negative feedback loop around the comparator 320. When the voltage at the input of the second squaring cell 310b is substantially equal to the root mean squared value of the voltage of RFIN, the negative feedback loop is in a stable state, and the output of the second squaring cell 310b represents the root mean squared value of the input of the second squaring cell 310b. The buffer 330 serves to amplify the output signal $V_{OUT}$. The output signal $V_{OUT}$ can be a linear-responding dc voltage with a conversion gain that is linear in volts per volts. The fourth detector resistor DR4a in combination with an external shunt capacitor (not illustrated) can create a low-pass filter response that reduces the residual ripple in the dc output voltage.

Figure 3B:
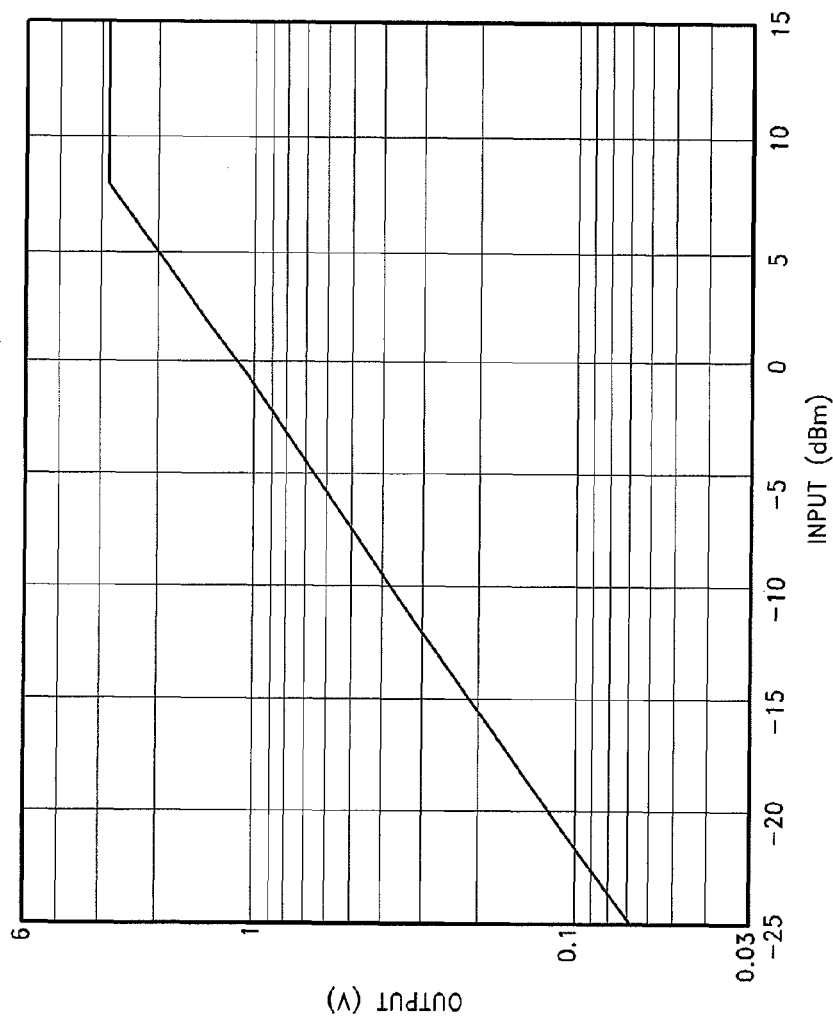
FIG. 3B is a graph of an example of a transfer function for the power detector of FIG. 3A.

FIG. 3B is a graph of a transfer function of the RF power detector 230 of FIG. 3A. As illustrated in FIG. 3B, the transfer function can be substantially linear. A transfer function models output voltage of a power detector as a function of input voltage. Both the x-axis and the y-axis of FIG. 3B have logarithmic scales. As a result, the illustrated transfer function is substantially linear, and the RF power detector 230 of FIG. 3A is a linear in volts per volt device. Thus, the transfer function can be modeled as $V_{OUT}=Slope\times V_{IN}+Intercept$. In addition, the y-intercept is close to zero, for example, about 0.07 V. Thus, the RF power detector 230 of FIG. 3A can be used for the embodiment described earlier in connection with FIGS. 1, 2A, and 2B.

Figure 4:
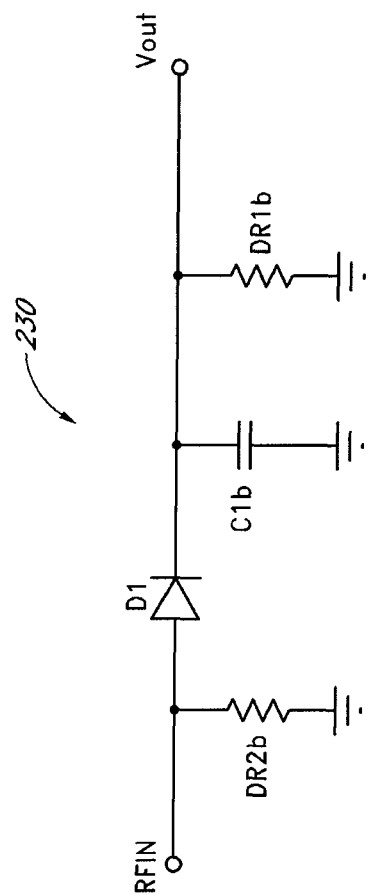
FIG. 4 is a schematic circuit diagram of another example of an RF power detector that can be used with the RF power detection circuit of FIG. 2A.

FIG. 4 illustrates another example of the RF power detector 230, which can be referred to as a diode detection circuit. The RF power detector 230 of FIG. 4 comprises a simple half-wave rectifier with output filtering. The illustrated detector 230 includes a diode D1, a first detector resistor DR1b, a second detector resistor DR2b, and a detector capacitor C1b.

With continued reference to FIG. 4, an input signal RFIN is provided to a first end of the second detector resistor DR2b and the anode of the diode D1. The cathode of the diode D1 is electrically coupled to a first terminal of the detector capacitor C1b and a first end of the first detector resistor DR1b. The cathode of the diode D2, the first terminal of the detector capacitor C1b, and the first end of the first detector resistor DR1b provide an output signal $V_{OUT}$. A second end of the first detector resistor DR1b, a second end of the second detector resistor DR2b, and a second terminal of the detector capacitor C1b are all electrically coupled to ground.

The second detector resistor DR2b can be used for impedance matching. In one embodiment, the second detector resistor DR2b can have a resistance between about 20Ω and about 150Ω, for example, about 68Ω. The resistance of DR2b can correspond to a nominal input impedance between about 25Ω and about 100Ω, for example, about 50Ω. A transfer function associated with the diode detector can be substantially linear, especially at certain temperatures. Accordingly, the transfer function can be modeled as $V_{OUT}=Slope\times V_{IN}+Intercept$. Thus, the RF power detector 230 of FIG. 4 is also a linear in volts per volt device.

A skilled artisan will appreciate that many variations, modifications, and additions to the diode detection circuit of FIG. 4 can be used in an RF power detector in accordance with certain embodiments. For example, a modified diode detector can incorporate temperature compensation, which can improve the linearity of the transfer function.

Figure 5:
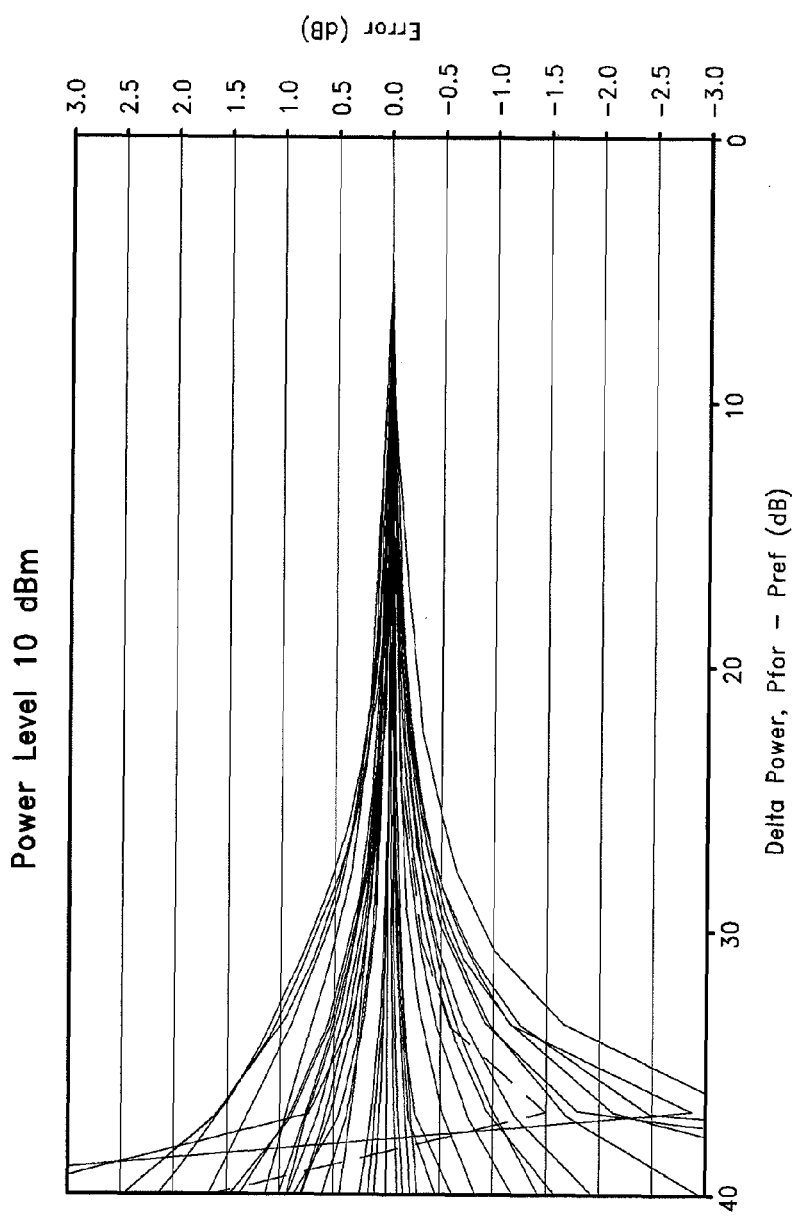
FIG. 5 is a graph illustrating the relationship among power difference between the forward power and the reflected power and error of the detection circuit of FIG. 2A.

FIG. 5 is a graph of a power difference between the forward power and the reflected power in decibels versus measurement error in decibels that can result from the embodiments described above. This relationship is illustrated at a power level of 10 dBm, where 1 dBm represents the power ratio in decibels referenced to one milliwatt, according to an embodiment of the RF power detection circuit 130 of FIGS. 2A and 2B.

FIG. 5 illustrates desirable characteristics of the RF power detection according to the embodiments without calibration. Typically, power differences of 20 dB or less are of particular interest. As shown in FIG. 5, the RF power detection circuit 130 works well because the error is low for power differences less than 20 dB. As also shown in FIG. 5, the detection circuit is more accurate for smaller power differences. Accordingly, the RF power detection circuit 130 of FIGS. 2A and 2B can provide an accurate indication of power loss that does not require calibration.

Applications

In the embodiments described above, the RF power detection systems were described in conjunction with a transmitter. A skilled artisan will, however, appreciate that the principles and advantages of the embodiments can be used for any other systems or apparatus that have needs for detection of characteristics of RF signals or any other signals. This includes, but is not limited to, transceivers, transmitter/receivers, and the like. As mentioned above, the embodiments described above can be used in both wired environments and wireless environments.

Such RF power detection systems can be implemented into various electronic devices. Examples of the electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, wireless devices, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a switch having at least a first node, a second node, and a third node, wherein the switch is configured to selectively operatively couple at least one of the first node or second node to the third node in response to a control signal; and
   a radio frequency (RF) power detector having a detector input, wherein the RF power detector is configured to generate a signal indicative of RF power at the detector input as an output of the detector, wherein the detector input is electrically coupled to the third node of the switch, wherein the signal indicative of power of the RF signal represents a forward RF power when the first node of the switch is operatively coupled to the third node of the switch, and wherein the signal indicative of power of the RF signal represents a reflected RF power when the second node of the switch is operatively coupled to the third node of the switch.

2. The apparatus of claim 1, further comprising a directional coupler having a first terminal, a second terminal, a third terminal, and a fourth terminal, wherein the third terminal is configured to extract a portion of an RF signal traveling in a direction from the first terminal to the second terminal, wherein the fourth terminal is configured to extract a portion of an RF signal traveling in a direction from the second terminal to the first terminal, the directional coupler configured to receive the RF signal at the first terminal and to generate an RF sample of the RF signal at the third terminal, wherein the third terminal is operatively coupled to the first node of the switch, and wherein the fourth terminal is operatively coupled to the second node of the switch.

3. The apparatus of claim 1, further comprising a processor having an input electrically coupled to the detector output, the processor configured to determine a ratio between a forward RF power and a reflected RF power without calibration.

4. The apparatus of claim 3, wherein the processor is further configured to determine a value representing a return loss, a reflection coefficient, or a voltage standing wave ratio.

5. The apparatus of claim 1, wherein the switch comprises a double throw absorptive RF switch.

6. The apparatus of claim 1, wherein the switch further comprises a fourth node operatively coupled to a dummy load, wherein the first node of the switch is operatively coupled to the fourth node when the second node of the switch is operatively coupled to the third node of the switch.

7. A method of calculating a ratio of forward RF power and reflected RF power, the method comprising:
   providing a directional coupler, a switch, an RF power detector, and a processor, wherein the switch is configured to selectively operatively couple at least one of a third terminal or a fourth terminal of the directional coupler to an input of the RF power detector, and wherein an input of the processor is electrically coupled to an output of the RF power detector;
   controlling the switch such that the output of the RF power detector is representative of a forward RF power;
   controlling the switch such that the output of the RF power detector is representative of a reflected RF power; and
   calculating, using the processor, a ratio of the forward RF power and the reflected RF power based on the output of the RF power detector without using factory calibration values.

8. The method of claim 7, wherein said controlling the switch such that the output of the RF power detector is representative of the reflected RF power includes changing a state of the switch in response to a power detection signal.

9. The method of claim 7, wherein said providing includes providing the directional coupler that is further configured to receive an RF signal at a first terminal.

10. The method of claim 9, wherein the forward RF power corresponds to a power of an RF signal traveling from the first terminal to the second terminal, and wherein the reflected RF power corresponds to a power of an RF signal traveling from the second terminal to the first terminal.

11. An apparatus comprising:
   an RF switch having at least a first node, a second node, and a third node, wherein the RF switch is configured to selectively electrically couple at least one of the first node and the second node to the third node in response to a control signal; and
   a directional coupler having a first terminal, a second terminal, a third terminal, and a fourth terminal, wherein the third terminal is operatively coupled to the first node of the RF switch, wherein the fourth terminal is operatively coupled to the second node of the RF switch, wherein the third terminal is configured to provide to the third node of the RF switch a portion of an RF signal traveling in a direction from the first terminal to the second terminal when the first node of the RF switch is electrically coupled to the third node of the RF switch, wherein the fourth terminal is configured to provide to the third node of the RF switch a portion of an RF signal traveling in a direction from the second terminal to the first terminal when second node of the RF switch is electrically coupled to the third node of the RF switch.

12. The apparatus of claim 11, further comprising a processor having an input electrically coupled to the third node of the RF switch via an RF power detector, the processor configured to determine a ratio between a forward RF power and a reflected RF power.

13. The apparatus of claim 12, wherein the processor is further configured to determine a value representing a return loss, a reflection coefficient, or a voltage standing wave ratio.

14. The apparatus of claim 11, wherein the signal indicative of power of the RF signal represents a forward RF power when the first node of the switch is operatively coupled to the third node of the switch, and wherein the signal indicative of power of the RF signal represents a reflected RF power when the second node of the switch is operatively coupled to the third node of the switch.

15. The apparatus of claim 11, wherein the switch comprises a double throw absorptive RF switch.

16. The apparatus of claim 11, wherein the switch further comprises a fourth node operatively coupled to a dummy load, wherein the first node of the switch is operatively coupled to the fourth node when the second node of the switch is operatively coupled to the third node of the switch.

17. The apparatus of claim 16, wherein the switch further comprises a fifth node operatively coupled to a second dummy load, wherein the second node of the switch is operatively coupled to the fifth node when the first node of the switch is operatively coupled to the third node of the switch.

* * * * *